(12) United States Patent
Cho

(10) Patent No.: US 9,143,101 B2
(45) Date of Patent: Sep. 22, 2015

(54) MOS TRANSCONDUCTANCE GAIN BOOSTING TECHNIQUES IN MILLIMETER-WAVE RANGE

(75) Inventor: Hsiu-Ying Cho, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 265 days.

(21) Appl. No.: 13/412,844

(22) Filed: Mar. 6, 2012

(65) Prior Publication Data

US 2013/0234221 A1    Sep. 12, 2013

(51) Int. Cl.
*H01L 27/06* (2006.01)
*H03F 3/45* (2006.01)

(52) U.S. Cl.
CPC .................................. *H03F 3/45179* (2013.01)

(58) Field of Classification Search
USPC .......... 257/296, 288, 213, 368, 379, E27.016; 330/360, 278, 254
See application file for complete search history.

(56) References Cited

U.S. PATENT DOCUMENTS

| 7,009,852 | B2 * | 3/2006 | Ying et al. | 363/17 |
| 7,420,425 | B2 * | 9/2008 | Tsai | 330/311 |
| 7,554,403 | B1 * | 6/2009 | Sakurai | 330/260 |
| 7,719,083 | B2 * | 5/2010 | Chang | 257/531 |
| 8,415,933 | B2 * | 4/2013 | Loikkanen et al. | 323/225 |
| 8,642,970 | B2 * | 2/2014 | Iwakiri et al. | 250/370.08 |

* cited by examiner

*Primary Examiner* — Roy Potter
*Assistant Examiner* — Damian A Hillman
(74) *Attorney, Agent, or Firm* — Eschweiler & Associates, LLC

(57) ABSTRACT

The present disclosure relates to a semiconductor device, such as a transistor. The device includes a gate terminal, a source terminal, a drain terminal, a transconductance component, and a boost component. The gate terminal is configured to receive a bias voltage. The drain terminal is coupled to the boost component. The transconductance component is coupled to the gate terminal, the source terminal and the drain terminal and provides an output current proportional to the bias voltage. The boost component is coupled to the transconductance component and boosts the output current at a selected frequency range.

15 Claims, 7 Drawing Sheets

MOS TRANSCONDUCTANCE GAIN BOOSTING TECHNIQUES IN MILLIMETER-WAVE RANGE

BACKGROUND

The transconductance of semiconductor devices, such as metal oxide semiconductor (MOS) transistors, determines the gain for the device. Transconductance is a property of certain electronic components. Conductance is the reciprocal of resistance. Transconductance is the ratio of the current change at an output port to a voltage change at an input port.

The transconductance is generally proportional to hole or electron mobility, at least for low drain voltages. However, as device sizes are reduced, the fields in the channel increase and dopant impurity levels can increase. Both impact carrier mobility and tend to lower transconductance. Furthermore, increasing the electric field in the channel can result in velocity saturation, thereby limiting the current and transconductance.

DETAILED DESCRIPTION

Figure 1:
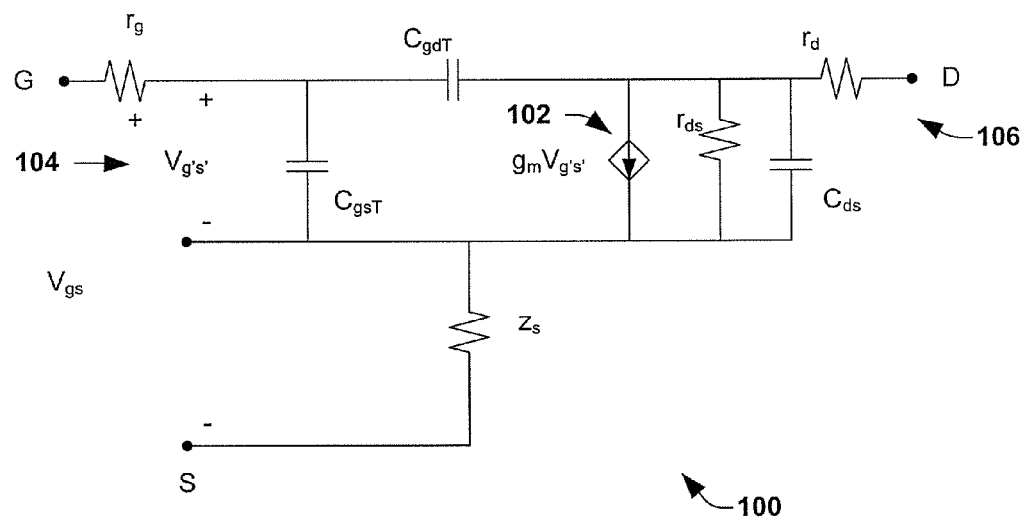
FIG. 1 is a schematic diagram of an equivalent circuit for a MOS device in order to illustrate transconductance.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

The transconductance gain for semiconductor devices is an important property. Conventional semiconductor devices, such as radio frequency (RF) metal oxide semiconductor (MOS) devices tend to have reduced transconductance gain as the frequency increases. In one example, the degradation is noticeable in the 60 to 100 Giga Hertz range. The degradation is particularly noticeable in the millimeter-wave range. Without correcting or compensating for the reduced transconductance gain at high frequencies, the applications that can use RF MOS devices are limited.

FIG. 1 is a schematic diagram of an equivalent circuit 100 for a MOS device in order to illustrate transconductance. The circuit 100 includes a gate (G), a source (S), and a drain (D). The circuit 100 additionally includes a gate resistor ($r_g$), a gate/source capacitor ($C_{gsT}$), a gate/drain capacitor ($C_{gdT}$), a source resistor ($Z_s$), a transconductance component 102 ($g_m V_{g's'}$), a drain/source resistor ($r_{ds}$), a drain/source capacitor ($C_{ds}$), and a drain resistor ($r_d$). The gate resistor ($r_g$) is coupled to the G terminal and the gate/source capacitor ($C_{gsT}$) and the gate/drain capacitor ($C_{gdT}$). A voltage across the gate/drain capacitor is designated as Vg's'. The source resistor ($Z_s$) is coupled to the gate/source capacitor and the transconductance component 102, the drain/source resistor ($r_{ds}$) and the drain/source capacitor ($C_{ds}$). A second end of the gate/drain capacitor is coupled to the transconductance component 102, the drain/source resistor, the drain/source capacitor and the drain resistor ($r_d$). The drain resistor is coupled to the drain terminal (D). The source resistor is coupled to the source terminal (S). A voltage across the gate and source is the gate/source voltage ($V_{gs}$).

The transconductance gain ($g_m$) of the circuit 100 is essentially a change in drain current at the drain ($I_{ds}$) divided by the small change in a gate/source voltage ($V_{gs}$). Typically, the higher the gain, the better. Thus, very small changes in voltage result in very large changes in current. In the equivalent circuit 100, the transconductance component 102 produces current proportional to the transconductance $g_m$ and the voltage 104 ($V_{g's'}$).

At low frequencies, the parasitic effects, which include capacitance values of the circuit 100, such as the gate/source capacitor, the gate/drain capacitor, and the drain/source capacitor, are relatively low and may be negligible. However, at higher frequencies the parasitic effects and capacitance values increase. These parasitic effects reduce the voltage $V_{g's'}$ 104 across the transconductance component 102. As a result, the current produced by the transconductance component 102 is reduced. As a consequence, the current output at the drain 106 is reduced for high frequencies.

Figure 2:
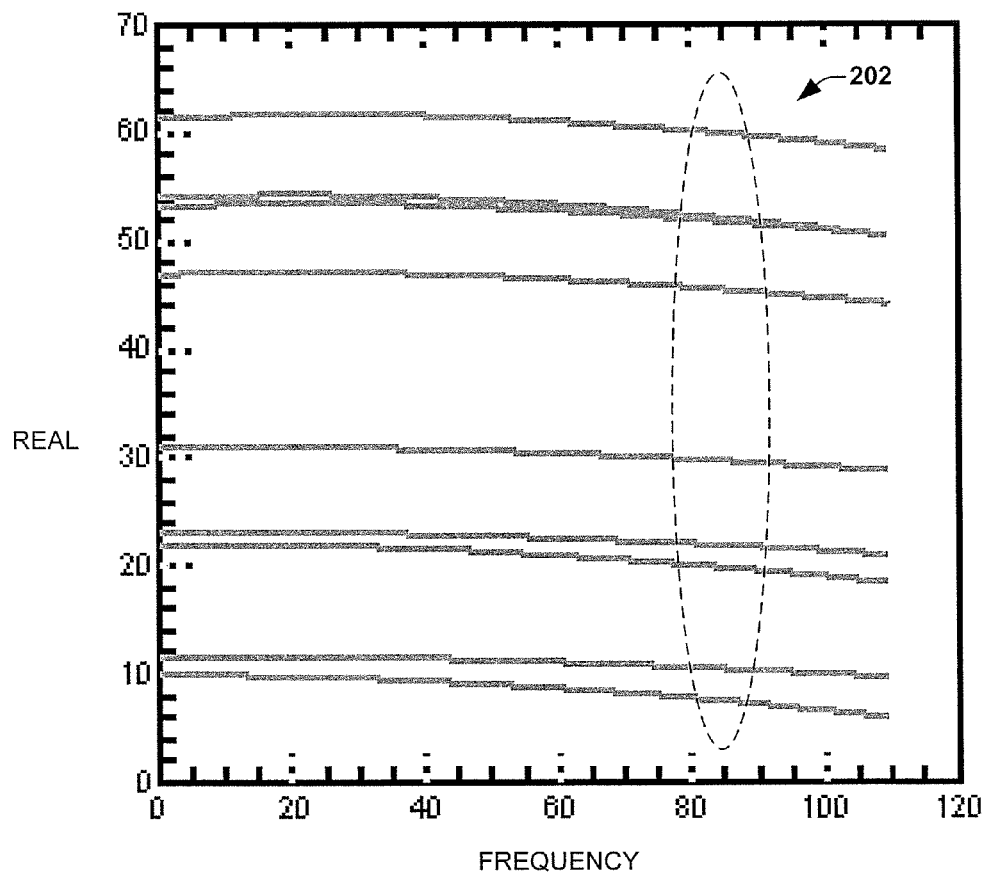
FIG. 2 is a graph illustrating transconductance gain degradation at high frequencies.

FIG. 2 is a graph 200 illustrating transconductance gain degradation at high frequencies. The graph 200 depicts the transconductance gain for a circuit such as the circuit 100 described above. An x-axis depicts frequencies in the giga hertz range and a y-axis depicts a real component of a transconductance gain.

In an ideal situation, the transconductance gain would be a flat line with no variation according to frequency. However, as shown above, degradation of the gain does occur, particularly at higher frequencies. In fact, substantial degradation is show at and above the 60 Giga Hertz range as indicated by region 202.

Figure 3:
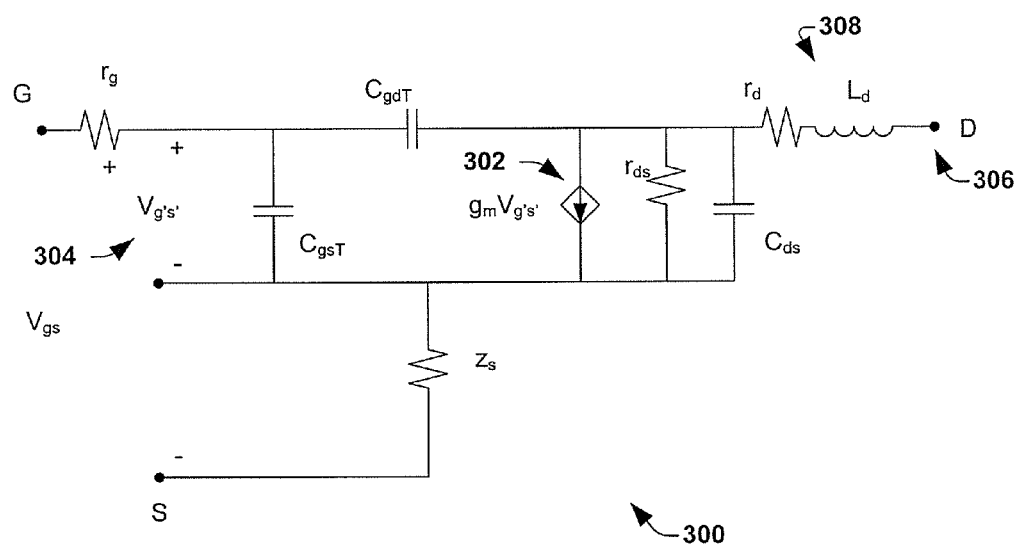
FIG. 3 is a schematic diagram illustrating an equivalent circuit that boosts transconductance gain at high frequencies in accordance with this disclosure.

FIG. 3 is a schematic diagram illustrating an equivalent circuit 300 that boosts transconductance gain at high frequencies in accordance with this disclosure. The circuit 300 includes a boost component 308 that compensates for the parasitic effects at high frequencies and boosts the transconductance gain at high frequencies.

The circuit 300, similar to the circuit 100 above, includes a gate (G), a source (S), and a drain (D) terminals. The circuit 300 additionally includes a gate resistor ($r_g$), a gate/source capacitor ($C_{gsT}$), a gate/drain capacitor ($C_{gdT}$), a source resistor ($Z_s$), a transconductance component 302 ($g_m V_{g's'}$), a drain/source resistor ($r_{ds}$), a drain/source capacitor ($C_{ds}$), a drain resistor ($r_d$), and a boost component 308. The gate resistor ($r_g$) is coupled to the G terminal and the gate/source capacitor ($C_{gsT}$) and the gate/drain capacitor ($C_{gdT}$). A voltage across the gate/drain capacitor is designated as Vg's'. The source resistor ($Z_s$) is coupled to the gate/source capacitor and the transconductance component 302, the drain/source resistor ($r_{ds}$) and the drain/source capacitor ($C_{ds}$). A second end of the gate/drain capacitor is coupled to the transconductance component 302, the drain/source resistor, the drain/source capacitor and the drain resistor ($r_d$). A second end of the drain resistor is coupled to the boost component 308. The boost component 308 is coupled to the drain terminal (D). The source resistor is coupled to the source terminal (S). A voltage across the gate and source is the gate/source voltage ($V_{gs}$).

As stated above, the transconductance gain ($g_m$) of the circuit 300 is essentially a change in drain current at the drain ($I_{ds}$) divided by the small change in a gate/source voltage ($V_{gs}$). Typically, the higher the gain, the better. Thus, very small changes in voltage result in very large changes in current. In the equivalent circuit 300, the transconductance component 302 produces current proportional to the transconductance $g_m$ and the voltage 304 ($V_{g's'}$).

At low frequencies, the parasitic effects, which include capacitance values of the circuit 300, such as the gate/source capacitor, the gate/drain capacitor, and the drain/source capacitor, are relatively low and may be negligible. However, at higher frequencies the parasitic effects and capacitance values increase. These parasitic effects reduce the voltage $V_{g's'}$, 304 across the transconductance component 302. As a result, the current produced by the transconductance component 302 is reduced. However, the boost component 308 compensates for the parasitic effects at the higher frequencies. At lower frequencies, the boost component 308 has a negligible or minor impact on the transconductance gain. However, at higher frequencies, the boost component 308 boosts the current products at the drain 306 by dissipating stored energy and resisting current change in view of the lower voltage 304 across the transconductance component 302.

The boost component 308 is configured to boost the transconductance gain at relatively high frequencies, such as 20 Giga Hertz and above or in the millimeter wavelength range. In one example, the boost component 308 includes an inductor Ld. The inductor has an inductance value selected to yield a desired boosting effect for a specified frequency range. In one example, an inductance value of 10 pH is selected to yield a desired boosting effect, such as is described below with regard to graph 400 and 500. In another example, a relatively small inductance value of 10 pH or below is sufficient to yield a desired boosting effect. In another example, the boost component 308 is configured to determine the parasitic effects and boost the gain by an amount to at least partially compensate or to compensate for the parasitic effects. However, it is appreciated that other suitable configurations of the boost component 308 are contemplated.

Figure 4:
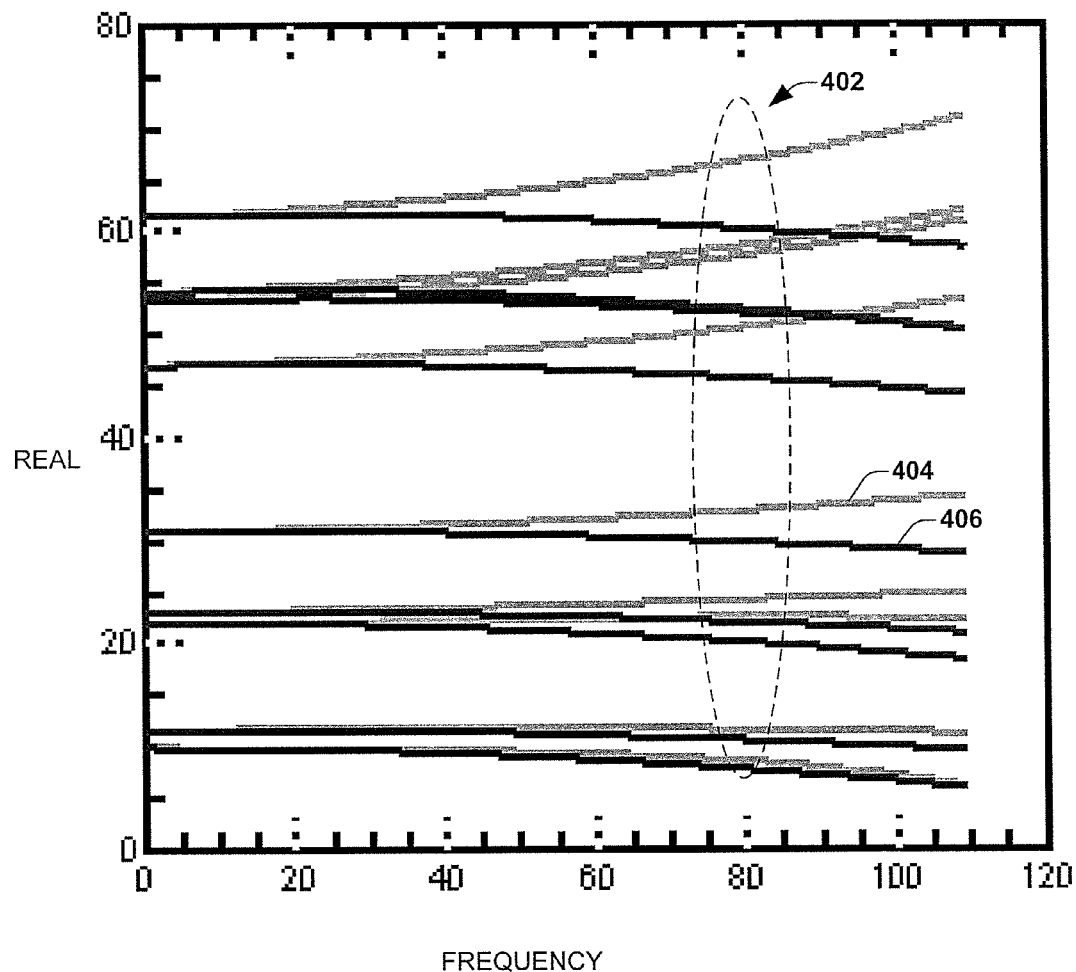
FIG. 4 is a graph illustrating transconductance gain boosting at high frequencies.

FIG. 4 is a graph 400 illustrating transconductance gain boosting at high frequencies. The graph 400 depicts a real portion of the transconductance gain for a circuit that includes a boost component, such as the circuit 300 described above and compares it with a circuit that does not include a boost component, such as the circuit 100. An x-axis depicts frequencies in the Giga hertz range and a y-axis depicts a real component of a transconductance gain.

In an ideal situation, the transconductance gain would be a flat line with no variation according to frequency. However, unlike the graph 200 of FIG. 2, degradation of the gain at high frequencies does not occur. In fact, enhancement or improvement of the transconductance gain is obtained at higher frequencies. For example, line 406 represents transconductance gain for a similar circuit, such as circuit 100 of FIG. 1, without a boost component and line 404 represents transconductance gain for a circuit, such as the circuit 300 of FIG. 3, with a boost component 308. It can be seen that the transconductance gain has been increased and degradation mitigated, particularly in the region 402.

Figure 5:
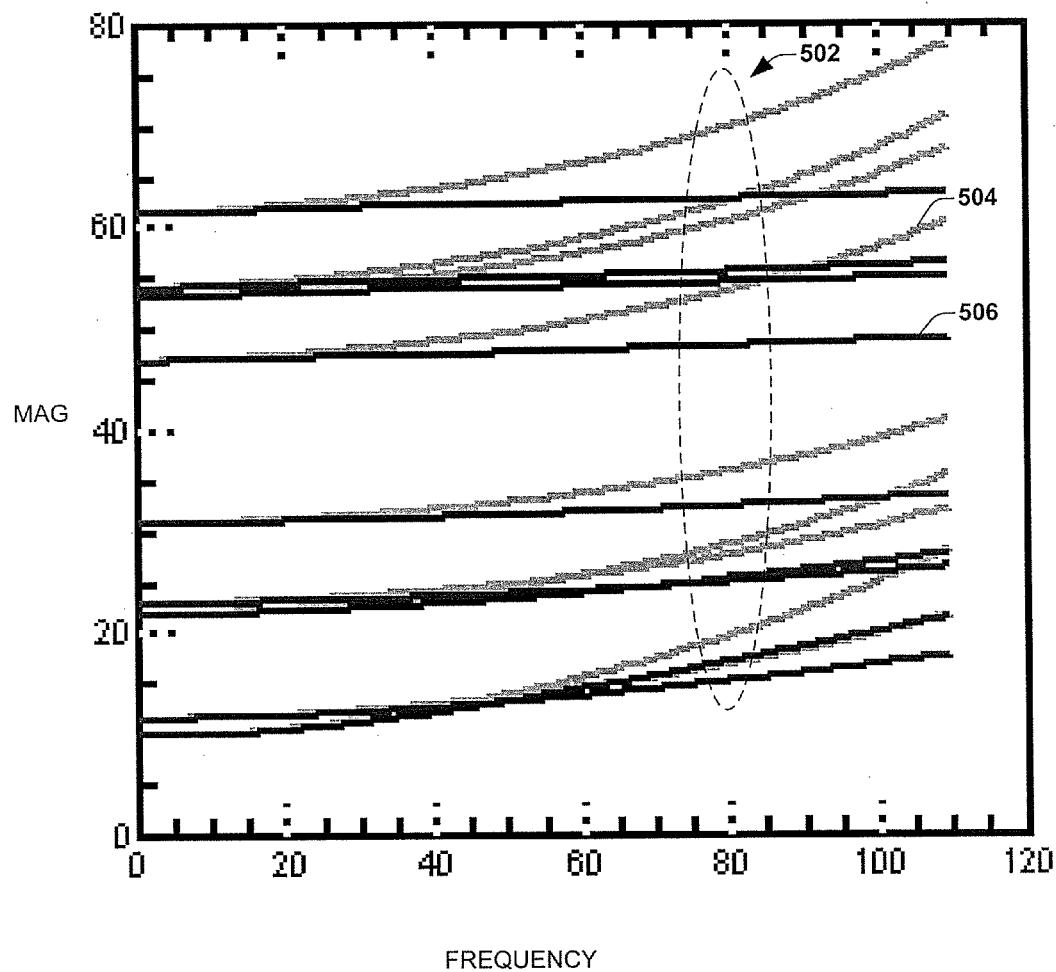
FIG. 5 is a graph illustrating an imaginary portion of transconductance gain boosting at high frequencies.

FIG. 5 is a graph 500 illustrating an imaginary portion of transconductance gain boosting at high frequencies. The graph 500 depicts the transconductance gain for a circuit that includes a boost component, such as the circuit 300 described above and for a circuit that does not include a boost component, such as the circuit 100 described above. An x-axis depicts frequencies in the Giga hertz range and a y-axis depicts an imaginary component of a transconductance gain.

In an ideal situation, the transconductance gain would be a flat line with no variation according to frequency. However, degradation of the imaginary portion of the gain at high frequencies does not occur for the circuits that include a boost component. In fact, enhancement or improvement of the transconductance gain is obtained at higher frequencies. For example, line 506 represents transconductance gain for a similar circuit, such as circuit 100 of FIG. 1, without a boost component and line 504 represents transconductance gain for a similar circuit, such as the circuit 300 of FIG. 3, which includes a boost component 308. It can be seen that the transconductance gain has been increased and degradation mitigated, particularly in the region 502.

Figure 6:
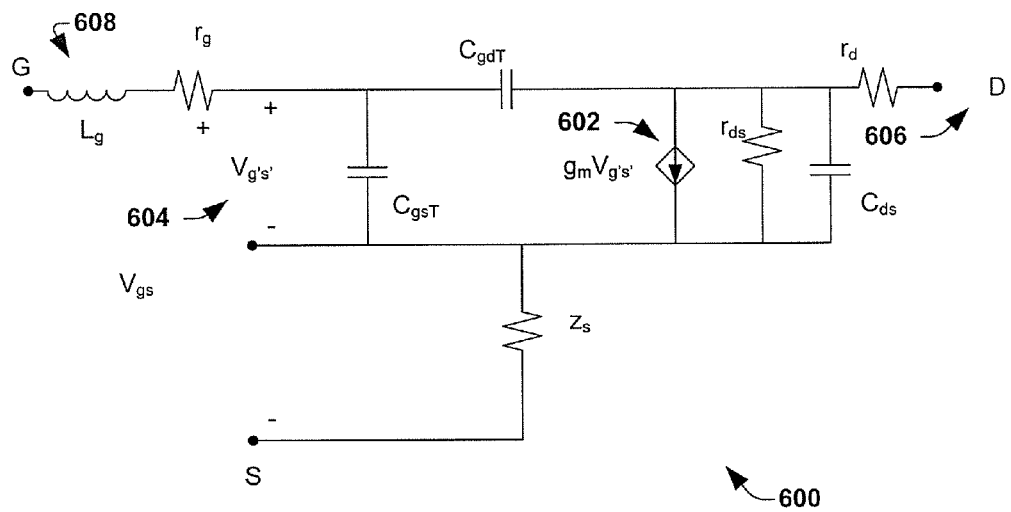
FIG. 6 is a schematic diagram illustrating an equivalent circuit that boosts transconductance gain at high frequencies in accordance with this disclosure.

FIG. 6 is a schematic diagram illustrating an equivalent circuit 600 that boosts transconductance gain at high frequencies in accordance with this disclosure. The circuit 600 includes a boost component 608 that compensates for the parasitic effects at high frequencies and boosts the transconductance gain at high frequencies.

The circuit 600, similar to the circuit 300 above, includes a gate (G), a source (S), and a drain (D) terminals. The circuit 600 additionally includes a gate resistor ($r_g$), a gate/source capacitor ($C_{gsT}$), a gate/drain capacitor ($C_{gdT}$), a source resistor ($Z_s$), a transconductance component 602 ($g_m V_{g's'}$), a drain/source resistor ($r_{ds}$), a drain/source capacitor ($C_{ds}$), a drain resistor ($r_d$), and a boost component 608. However, instead of the gate resistor ($r_g$) being coupled to the G terminal, the boost component 608 is coupled to the gate terminal. The gate resistor is coupled to the boost component and the gate/source capacitor ($C_{gsT}$) and the gate/drain capacitor ($C_{gdT}$). A voltage across the gate/drain capacitor is designated as Vg's'. The source resistor ($Z_s$) is coupled to the gate/source capacitor and the transconductance component 602, the drain/source resistor ($r_{ds}$) and the drain/source capacitor ($C_{ds}$). A second end of the gate/drain capacitor is coupled to the transconductance component 602, the drain/source resistor, the drain/source capacitor and the drain resistor ($r_d$). A second end of the drain resistor is coupled to the drain terminal (D). The source resistor is coupled to the source terminal (S). A voltage across the gate and source is the gate/source voltage ($V_{gs}$). The equivalent circuit 600, the transconductance component 602 produces current proportional to the transconductance $g_m$ and the voltage 604 ($V_{g's'}$).

At low frequencies, the parasitic effects, which include capacitance values of the circuit 600, such as the gate/source capacitor, the gate/drain capacitor, and the drain/source capacitor, are relatively low and may be negligible. However, at higher frequencies the parasitic effects and capacitance values increase. These parasitic effects reduce the voltage $V_{g's'}$, 604 across the transconductance component 602. As a result, the current produced by the transconductance component 602 is reduced. However, the boost component 608 compensates for the parasitic effects at the higher frequencies. At lower frequencies, the boost component 608 has a negligible or minor impact on the transconductance gain. However, at higher frequencies, the boost component 608 boosts the current products at the drain 606 by dissipating stored energy and resisting current change in view of the lower voltage 604 across the transconductance component 602.

The boost component 608 is configured to boost the transconductance gain at relatively high frequencies, such as 20 Giga Hertz and above. In one example, the boost component 608 includes an inductor Ld. The inductor has an inductance value selected to yield a desired boosting effect for a specified frequency range. In one example, an inductance value of 10 pH is selected to yield a desired boosting effect, such as is described below with regard to graph 400 and 500. In another example, a relatively small inductance value of 10 pH or below is sufficient to yield a desired boosting effect. However, it is appreciated that other suitable configurations of the boost component 608 are contemplated.

Figure 7:
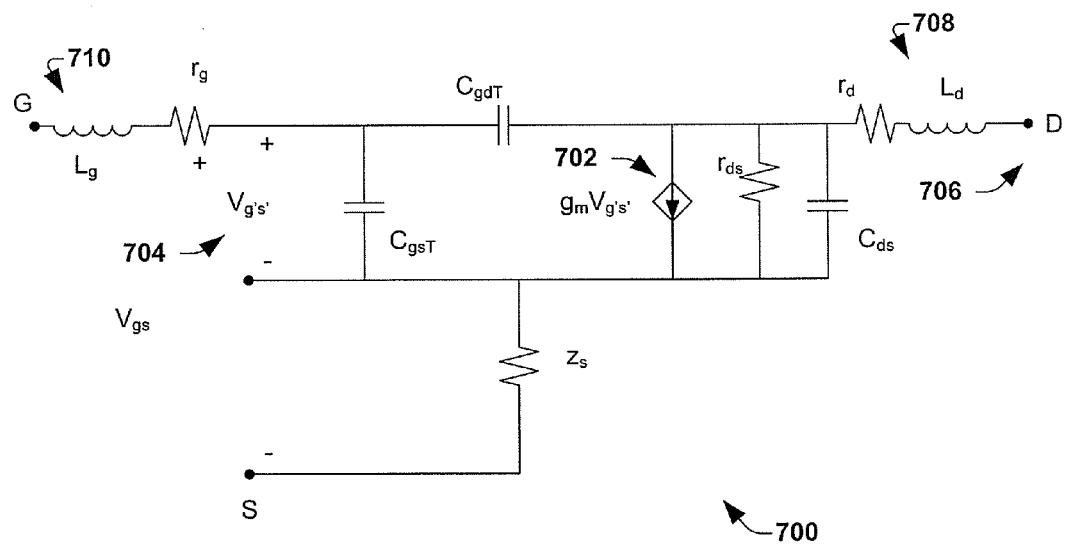
FIG. 7 is a schematic diagram illustrating an equivalent circuit that boosts transconductance gain at high frequencies in accordance with this disclosure.

FIG. 7 is a schematic diagram illustrating an equivalent circuit 700 that boosts transconductance gain at high frequencies in accordance with this disclosure. The circuit 700 includes a first boost component 708 and a second boost component 710 that compensate for the parasitic effects at high frequencies and boosts the transconductance gain at high frequencies.

The circuit 700, similar to the circuit 300 above, includes a gate (G), a source (S), and a drain (D) terminals. The circuit 700 additionally includes a gate resistor ($r_g$), a gate/source capacitor ($C_{gsT}$), a gate/drain capacitor ($C_{gdT}$), a source resistor ($Z_s$), a transconductance component 702 ($g_m V_{g's'}$), a drain/source resistor ($r_{ds}$), a drain/source capacitor ($C_{ds}$), a drain resistor ($r_d$), and a boost component 708. The second boost component 710 is coupled to the gate terminal. The gate resistor is coupled to the second boost component 710 and the gate/source capacitor ($C_{gsT}$) and the gate/drain capacitor ($C_{gdT}$). A voltage across the gate/drain capacitor is designated as Vg's'. The source resistor ($Z_s$) is coupled to the gate/source capacitor and the transconductance component 702, the drain/source resistor ($r_{ds}$) and the drain/source capacitor ($C_{ds}$). A second end of the gate/drain capacitor is coupled to the transconductance component 702, the drain/source resistor, the drain/source capacitor and the drain resistor ($r_d$). A second end of the drain resistor is coupled to the first boost component 708. A second end of the boost component 708 is coupled to the drain terminal (D). The source resistor is coupled to the source terminal (S). A voltage across the gate and source is the gate/source voltage ($V_{gs}$). The equivalent circuit 700, the transconductance component 702 produces current proportional to the transconductance $g_m$ and the voltage 704 ($V_{g's'}$).

As show above, the current produced by the transconductance component 702 is reduced at high frequencies. However, the first and second boost components 708 and 710 compensate for the parasitic effects at the higher frequencies. At lower frequencies, the first and second boost components 708 and 710 have a negligible or minor impact on the transconductance gain. However, at higher frequencies, the first and second boost components 708 and 710 boost the current products at the drain 706 by dissipating stored energy and resisting current change.

The first and second boost components 708 and 710 are configured to boost the transconductance gain at relatively high frequencies, such as 20 Giga Hertz and above. In one example, the second boost component 708 includes a drain boost inductor $L_d$ and the first boost component includes an gate boost inductor Lg. The inductors have an inductance value selected to yield a desired boosting effect for a specified frequency range. In one example, an inductance value of 10 pH is selected to yield a desired boosting effect, such as is described below with regard to graph 400 and 500. In another example, a relatively small inductance value of 10 pH or below is sufficient to yield a desired boosting effect. However, it is appreciated that other suitable configurations of the boost components 708 and 710 are contemplated. Further, it is appreciated that the individual boost components can have varied inductance values from each other. Additionally, it is appreciated that the boost components can include multiple inductors and/or other components.

Figure 8:
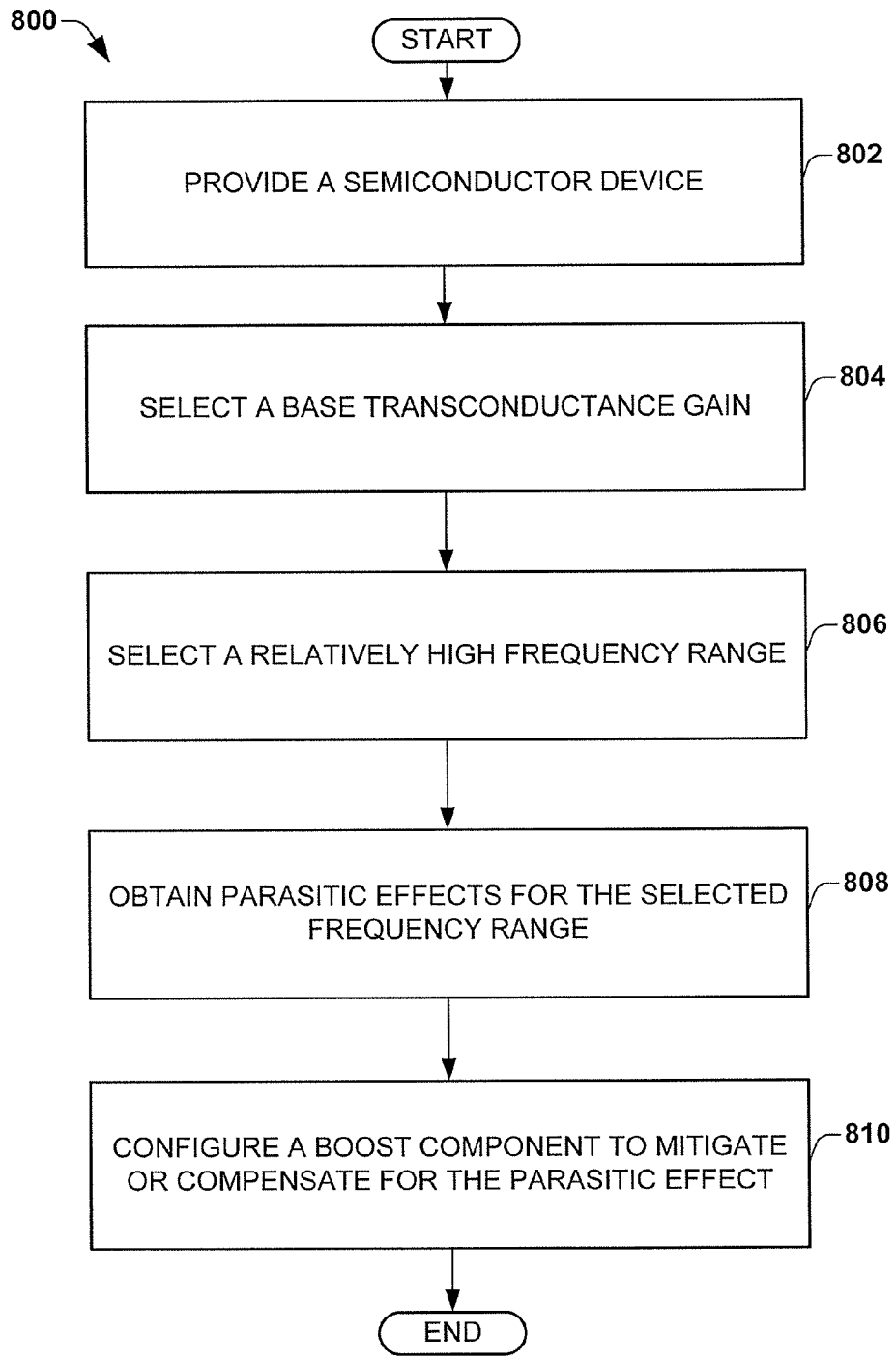
FIG. 8 is a flow diagram illustrating a method of boosting a transconductance gain of a circuit in accordance with this disclosure.

FIG. 8 is a flow diagram illustrating a method 800 of boosting a transconductance gain of a circuit in accordance with this disclosure. The method 800 mitigates the parasitic effects for transistor devices, including, but not limited to MOS and RF MOS devices. The method 800 mitigates the effects at high frequencies by boosting the gain via a boost component.

The method begins at block 802, wherein a semiconductor device is provided. The semiconductor device includes an RF MOS device in this example. In one example, the device includes a source, a drain, and a gate and provides a current at the drain proportional to a bias voltage applied to the gate.

A transconductance gain is selected for the device at block 804. The transconductance gain is a value representing a change in output current due to a change across an input terminal. For example, as shown in FIG. 3, the transconductance gain is the change in output current at the drain according to the voltage 304 applied to the gate.

A relatively high operating frequency range is selected at block 806. The frequency range can be selected to meet application or operating environment requirements. In one example, the high frequency range is 20 Giga Hertz and above.

Parasitic effects for the selected frequency range are determined or obtained at block 808. In one example, an equivalent circuit is created to simulate the semiconductor device and the transconductance gain is calculated for the frequency range. The parasitic effects can be expressed in terms of components of the equivalent circuit or as a specific reduction in the transconductance gain at the selected frequency range compared to the transconductance gain at a lower frequency range, such as 1 kilo Hertz.

A boost component is configured to mitigate and/or compensate for the parasitic effects at block 810. The boost component is configured to boost the transconductance gain at the selected frequency range. In one example, the boost is obtained by boosting drain current for at least the selected frequency range. In another example, the boost component comprises an inductor. The inductor is selected to have an inductance that yields a selected boost effect. The boost effect at least partially compensates for the parasitic effects. In another example, the boost component is configured to yield a boost effect that more than compensates for the parasitic effects and, thereby, increases the transconductance gain at the selected frequency range.

Once configured, the semiconductor device can be operated at the selected frequency range and provide the selected, boosted transconductance value. Further, the semiconductor device can operate at lower frequency ranges and have the base transconductance gain. The lower frequency ranges are less than the selected frequency range.

The present disclosure relates to a semiconductor device, such as a transistor. The device includes a gate terminal, a source terminal, a drain terminal, a transconductance component, and a boost component. The gate terminal is configured to receive a bias voltage. The drain terminal is coupled to the boost component. The transconductance component is coupled to the gate terminal, the source terminal and the drain terminal and provides an output current proportional to the bias voltage. The boost component is coupled to the transconductance component and boosts the output current at a selected frequency range.

The present disclosure also includes another semiconductor device, such as a transistor device. The device includes a drain terminal, a source terminal, a gate terminal, a transconductance component, a drain boost component, and a gate boost component. The gate terminal is configured to receive a bias voltage. The drain terminal is configured to provide an output current. The transconductance component is configured to provide the output current proportional to changes in the bias voltage. The drain boost component is coupled to the transconductance component and the drain terminal. The drain boost component is configured to boost the output current at a first selected frequency range by a first amount. For example, the first selected frequency range can be at least 10 Giga Hertz. In another, the first selected frequency range is at least 1 Giga Hertz. The first amount at least partially compensates for parasitic effects at the first selected frequency range. The gate boost component is configured to boost the output current at a second selected frequency range by a second amount. The second selected frequency range can be the same as the first selected frequency range, overlap, or vary. The second amount at least partially compensates for parasitic effects at the second selected frequency range.

The present disclosure further relates to a method for boosting transconductance gain of a device. The semiconductor device is provided and includes a gate, source, and drain. A transconductance gain is selected for the device. The gain can be selected to meet application requirements. The selected gain does not account for parasitic effects. A frequency range for the device is selected. The frequency range is typically at a relatively high frequency, such as at least 1 Giga Hertz. In another example, the selected frequency range is at least 80 Giga Hertz. The parasitic effects for the selected frequency range are determined. The parasitic effects include parasitic capacitances, such as those from parasitic gate/source capacitors, parasitic drain/source capacitors, and the like. A boost component is configured to increase the transconductance gain of the device for the selected frequency range. The increased gain at least partially compensates for the parasitic effects at the selected frequency range. Drain current is provided within the selected frequency range having an increase transconductance gain, due to boost effects of the boost component.

It will be appreciated that while reference is made throughout this document to exemplary structures in discussing aspects of methodologies described herein (e.g., the structure presented in FIGS. 1-7, while discussing the methodology set forth in FIG. 8), that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A semiconductor device comprising:
   a drain terminal;
   a source terminal;
   a gate terminal configured to receive a bias voltage;
   a transconductance component coupled to the gate terminal and the source terminal, wherein the transconductance component is configured to provide an output current proportional to changes to the bias voltage, the output current is provided at the drain terminal;
   a drain boost component coupled to the transconductance component and the drain terminal, wherein the drain boost component includes a drain inductor, and wherein the drain boost component is configured to boost the output current at a first selected frequency range by a first amount; and
   a gate boost component coupled to the transconductance component and the gate terminal, wherein the gate boost component is configured to boost the output current at a second selected frequency range by a second amount.

2. The device of claim 1, wherein the transconductance component is impacted by parasitic effects at the first and second selected frequency ranges.

3. The device of claim 1, further comprising parasitic components coupled to the gate terminal.

4. The device of claim 1, wherein the bias voltage is applied across the gate terminal and the source terminal.

5. The device of claim 1, wherein the gate boost component is configured to determine parasitic effects at the second selected frequency range.

6. The device of claim 5, wherein the gate boost component is configured to at least partially compensate for the parasitic effects.

7. The device of claim 1, wherein the drain inductor has an inductance value selected to boost the output current by the first amount in the first selected frequency range to compensate for parasitic capacitances.

8. The device of claim 1, wherein the gate boost component does not include an inductor.

9. The device of claim 1, wherein the gate boost component and the drain boost component include a plurality of inductors.

10. The device of claim 1, wherein the first selected frequency range overlaps the second selected frequency range.

11. The device of claim 10, wherein the second selected frequency range is varied from the first selected frequency range.

12. The device of claim 1, wherein the gate boost component includes a gate inductor.

13. The device of claim 1, further comprising a parasitic gate/source capacitor coupled to the gate terminal.

14. A semiconductor device comprising:
    a drain terminal;
    a source terminal;
    a gate terminal configured to receive a bias voltage;

a transconductance component coupled to the gate terminal and the source terminal, wherein the transconductance component is configured to provide an output current proportional to changes to the bias voltage, the output current is provided at the drain terminal;

a drain boost component coupled to the transconductance component and the drain terminal, wherein the drain boost component is configured to boost the output current at a first selected frequency range by a first amount; and a gate boost component coupled to the transconductance component and the gate terminal, wherein the gate boost component is configured to boost the output current at a second selected frequency range by a second amount, wherein the first amount is greater than the second amount.

15. A semiconductor device comprising:

a drain terminal;

a source terminal;

a gate terminal configured to receive a bias voltage;

a transconductance component coupled to the gate terminal and the source terminal, wherein the transconductance component is configured to provide an output current proportional to changes to the bias voltage, the output current is provided at the drain terminal;

a drain boost component coupled to the transconductance component and the drain terminal, wherein the drain boost component is configured to boost the output current at a first selected frequency range by a first amount; and a gate boost component coupled to the transconductance component and the gate terminal, wherein the gate boost component is configured to boost the output current at a second selected frequency range by a second amount, wherein the second amount is greater than the first amount.

* * * * *